United States Patent
Ajmera et al.

[11] Patent Number: 6,057,220
[45] Date of Patent: May 2, 2000

[54] TITANIUM POLYCIDE STABILIZATION WITH A POROUS BARRIER

[75] Inventors: Atul C. Ajmera; Christine Dehm, both of Wappingers Falls; Anthony G. Domenicucci, New Paltz; George G. Gifford, Poughkeepsie; Stephen K. Loh, Fishkill; Christopher Parks, Beacon; Viraj Y. Sardesai, Poughkeepsie, all of N.Y.

[73] Assignees: International Business Machines Corporation, Armonk, N.Y.; Infineon Technologies North America Corporation, San Jose, Calif.

[21] Appl. No.: 08/936,029

[22] Filed: Sep. 23, 1997

[51] Int. Cl.[7] .......................... H01L 21/44; H01L 21/425
[52] U.S. Cl. ............................ 438/597; 438/527; 438/528
[58] Field of Search ................................ 438/597, 528, 438/527, 257

[56] References Cited

U.S. PATENT DOCUMENTS

| | | | |
|---|---|---|---|
| 4,690,730 | 9/1987 | Tang et al. | 437/237 |
| 4,784,973 | 11/1988 | Stevens et al. | |
| 4,931,411 | 6/1990 | Tigelaar et al. | 437/192 |
| 5,330,921 | 7/1994 | Yoshida et al. | 437/25 |
| 5,358,893 | 10/1994 | Yang et al. | 437/70 |
| 5,518,958 | 5/1996 | Giewont et al. | |
| 5,536,947 | 7/1996 | Klersy et al. | |
| 5,543,362 | 8/1996 | Wu . | |
| 5,545,574 | 8/1996 | Chen et al. | |
| 5,585,300 | 12/1996 | Summerfelt . | |
| 5,739,064 | 4/1998 | Hu et al. | 438/528 |
| 5,766,991 | 6/1998 | Chen | 438/231 |
| 5,874,351 | 2/1999 | Hu et al. | 438/527 |

FOREIGN PATENT DOCUMENTS

| | | |
|---|---|---|
| 0 682 359 A1 | 5/1995 | European Pat. Off. . |
| 0 780 889 A2 | 12/1996 | European Pat. Off. . |
| 0 905 751 A2 | 9/1998 | European Pat. Off. . |

OTHER PUBLICATIONS

K. Kobushi et al.; "A High Integrity and Low Resistance Ti–Polycide Gate Using a Nitrogen Ion–Implanted Buffer Layer"; Japanese Journal of Applied Physics/Part 2: Letters 27; (1988) Nov.; pp. L2158–L2160.

Hosoya et al.; "A Polycide Gate Electrode with a Conductive Diffusion Barrier Formed with ECR Nitrogen for Dual Gate CMOS"; IEEE Transactions on Electron Devices; vol. 42, No. 12, Dec. 1995; pp. 2111–2116.

P.C. Li and E. Mayen, Gate Dielectric Structure for Field–Effect Transistors, Jan. 1975, IBM Technical Disclosure Bulletin, vol. 17, No. 8, p. 2330.

M.R. Poponiak and P.J. Tsang, Thick Wear Resistant Coatings for Silicon Devices, May 1976, IBM Technical Disclosure Bulletin, vol. 18, No. 12, p. 4008.

Double–Layer Insulation of Polymide and Perforated Nitride, Mar. 1985, IBM Technical Disclosure Bulletin, vol. 27, No. 10A, pp. 5835–5836.

*Primary Examiner*—John F. Niebling
*Assistant Examiner*—Walter L. Lindsay, Jr.
*Attorney, Agent, or Firm*—Whitham, Curtis & Whitham; Steven Capella, Esq.

[57] ABSTRACT

A "porous barrier" is formed without formation of a discrete barrier layer by enriching grain boundaries of a body of polysilicon with nitrogen to inhibit thermal mobility of silicon species therealong. In a polycide gate/interconnect structure, the reduced mobility of silicon suppresses agglomeration of silicon in a metal silicide layer formed thereon. Since silicon agglomeration is a precursor of a polycide inversion phenomenon, polycide inversion which can pierce an underlying oxide and cause device failure is effectively avoided. The increased thermal stability of polycide structures and other structures including a body of polysilicon thus increases the heat budget that can be withstood by the structure and increases the manufacturing process window imposed by the presence of polysilicon which can be exploited in other processes such as annealing to develop a low resistance phase of refractory metal silicide included in the polycide structure, drive-in annealing for formation of source/drain regions of field effect transistors and the like.

11 Claims, 2 Drawing Sheets

TITANIUM POLYCIDE STABILIZATION WITH A POROUS BARRIER

BACKGROUND OF THE INVENTION

1. Field of the Invention

The present invention generally relates to the manufacture of semiconductor devices including metal polycide processes and, more particularly, to the prevention of high resistance formations due to agglomeration and inversion in conductors and other integrated circuit structures formed at high integration density.

2. Description of the Prior Art

Current ultra-large scale integrated circuits (ULSI), particularly those embodied in complementary metal-oxide-semiconductor (CMOS) technology, use polysilicon transistor gate electrodes capped with a low-resistance metal silicide layer. Corresponding structures may be employed for control gates of non-volatile memory cells. This combination of layers is often referred to in the art as a polycide structure. This polycide structure provides low sheet resistance in order to increase circuit performance in reducing RC time constant signal propagation delays since the interconnect resistance often limits performance of the ULSI integrated circuit. The low sheet resistance of the polycide structure becomes more critical as cross-sectional dimensions are reduced with increases in integration density.

In the process used to form the polycide structure, a refractory metal silicide is deposited on unpatterned doped polysilicon. A dielectric is then deposited to cover and electrically insulate the silicide layer. The sequence of layers is patterned and then heated to crystallize the silicide to develop the low sheet resistance properties thereof. As is known in the art, source and drain regions of CMOS structures are then formed using spacers and ion implants followed by annealing to correct implantation damage and diffuse the source and drain regions to a desired position, dopant/impurity concentration and profile, generically referred to as "drive in". It is particularly necessary that the polycide structure achieve its low sheet resistance properties during the annealing process and retain its low resistance properties through other high temperature processes such as dielectric reflow anneals which are often performed at temperatures in excess of 850° C.

Titanium silicide is frequently used as a gate conductor in ULSI and other integrated circuits since it has the lowest sheet resistance among the refractory metal silicides. However, titanium silicide is a polymorphic material having both high and low resistance phases. The low temperature phase (e.g. C49, generally formed as it is deposited) is of relatively high resistance and must be transformed into the low resistance phase (e.g. C54) by an annealing process at a temperature in excess of 700° C. The phase transformation becomes more difficult at decreasing cross-sectional dimensions of the polycide structure as the grain size becomes comparable to the conductor width or thickness. For conductors smaller than 0.5 $\mu$m or in the so-called half-micron and smaller regimes, temperatures in excess of 850° C. are needed for full phase transformation. However, these elevated temperatures have been observed to cause degradation of the low resistance properties of such fine conductors, particularly in comparison with the sheet resistance which should be achieved.

For titanium silicide, this thermal instability and degradation of conductivity is principally due to silicon agglomeration as silicon diffuses into the silicide layer from the polysilicon layer adjacent (e.g. below) it. The diffused silicon precipitates, enlarging or forming silicon grains which become large enough to fill a significant portion of the cross-section of the silicide layer, if not the entire cross-section thereof. Since the silicon grains are of substantial resistivity, it can be appreciated that agglomerations of silicon can compromise both performance and/or manufacturing yield of the integrated circuit. (Reliability of "tested good" devices is not generally affected since high resistance on minimum dimension structures can be readily detected during testing of either the performance, such as maximum clock rate, or functionality of the device.)

A more severe form of degradation is referred to as polycide inversion, for which agglomeration may be considered a precursor phenomenon. Polycide inversion occurs during annealing processes at higher temperatures and/or for longer periods of time than the annealing processes in which agglomeration is observed. In polycide inversion, both silicon and titanium diffuse into their complementary layers (e.g. titanium into the doped polysilicon as well as silicon into the silicide) with the result that the silicon and silicide exchange layers in local, randomly distributed locations. The effects may be more severe since both layers are disrupted and, at some locations, titanium may penetrate the very thin gate oxide of transistors, causing device failure.

Thus, as integration density increases and conductor cross-sectional dimensions become correspondingly smaller, the temperature and/or duration of the anneal to produce a low resistance phase of the silicide must be increased, increasing the likelihood that agglomeration and, possibly, polycide inversion, will occur. Thus, the "process window" becomes smaller and process parameters become more critical as integration density increases.

While some processes are known which can increase the "process window" somewhat, none is fully successful for current or foreseeable feature size regimes and each presents additional problems which must be overcome. For example, thickening of the silicide layer increases cross-sectional area of the connection without increasing line width. However, the increased aspect ratio of the conductors thus produced introduces additional difficulty in reducing resolution of lithographic processes for gate etching and production of void-free gap filling. Therefore this expedient cannot be easily extended beyond the half-micron regime.

Rapid thermal anneal (RTA) processes which rapidly raise and lower wafer temperatures can increase the process window by reducing the time during which diffusion, and, hence, agglomeration and polycide inversion can occur. However, due to the increasing difficulty of producing a low resistance phase with decreasing cross-sectional dimensions of conductors, RTA is not generally sufficient for line widths in the half-micron regime. Reducing the thermal budget generally does not produce complete phase transformation and results in a trade-off between device performance (e.g. signal propagation speed) and manufacturing yield in small feature size regimes. Addition of phase transformation promoting agents such as metallics, as are disclosed in U.S. Pat. No. 5,510,295, entitled Method for Lowering the Phase Transformation Temperature of a Metal Silicide, may lower the process temperature but do not improve overall thermal stability unless subsequent process temperatures can be kept low and thus provide no effective increase in the process window.

Thus, it is seen that processes that provide for reliable manufacture of silicide structures at high yield as feature size is reduced beyond the half-micron regime have small or negligible process windows against silicon agglomeration and/or process inversion.

SUMMARY OF THE INVENTION

It is therefore an object of the present invention to provide an improved process for forming a metal silicide conductor in an integrated circuit.

It is another object of the invention to provide a metal silicide conductor of improved thermal stability and which is less susceptible to thermal degradation by agglomeration and inversion.

It is a further object of the invention to extend the properties of low sheet resistance of polymorphic metal silicides and titanium silicide, in particular, to structures smaller than the half-micron feature size regime.

In order to accomplish these and other objects of the invention, a method for improving thermal stability of a metal polycide structure is provided including the steps of enriching grain boundaries of a polysilicon layer with nitrogen and forming a metal silicide layer directly on the polysilicon layer.

In accordance with another aspect of the invention, a method of forming a body of polysilicon exhibiting reduced thermal mobility of silicon is provided comprising the steps of enriching grain boundaries in the body of polysilicon with nitrogen, and exposing the surface of the body of polysilicon.

In accordance with a further aspect of the invention, a semiconductor device is provided including a body of polysilicon, and a porous barrier comprising nitrogen enrichment of grain boundaries within the body of polysilicon.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
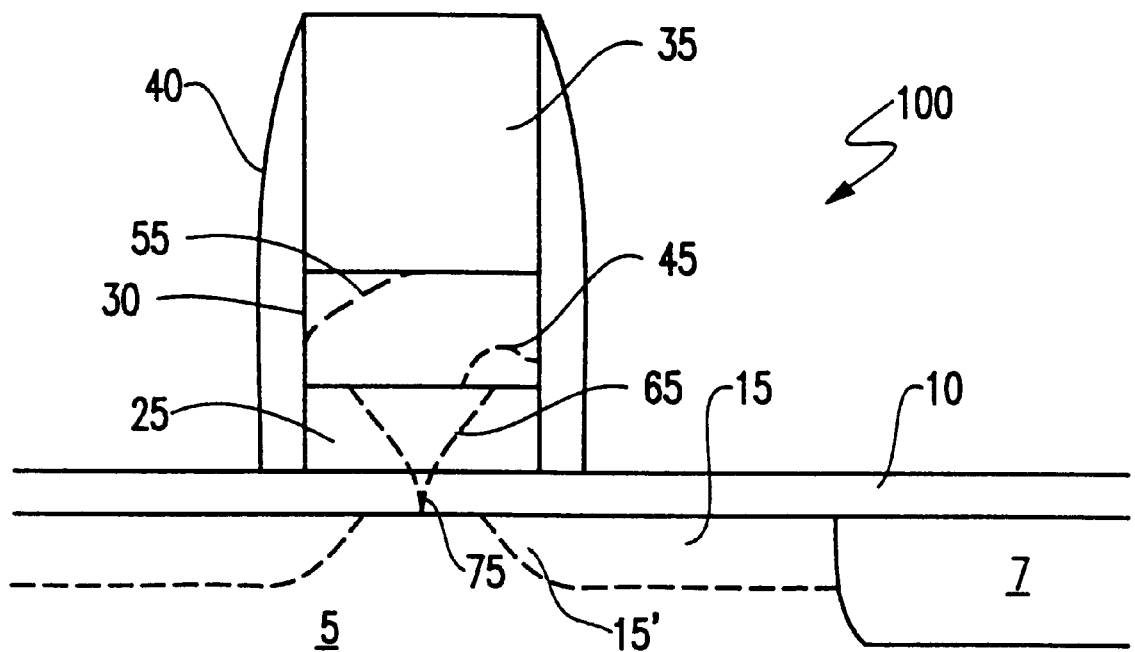
FIG. 1 is a cross-sectional view of a gate structure (also representative of a conductor structure) formed in accordance with the invention and useful in understanding the principles of the invention.

Referring now to the drawings, and more particularly to FIG. 1, there is shown, in cross-section, a field-effect transistor gate or interconnect structure 100 of a design which is known by and familiar to those skilled in the semiconductor art. It should be understood, however, that while the design is known, the depiction is idealized to some degree in regard to structure actually formed, depending on the size at which it is fabricated. That is, as alluded to above, if the cross-sectional dimensions of the polysilicon layer 25 and the metal silicide layer 30, together are greater than one micron, the structure depicted can be and has been formed much in the manner depicted with only silicon agglomeration inclusions (e.g. 45) which are insignificant to the operation of the device and may be functionally undetectable.

However, in feature size regimes smaller than one-half micron an agglomeration inclusion such as that depicted at 45 would scale to the relative size depicted at 55 and, hence, the structure depicted is not reliably producible at the state of the art prior to the present invention and FIG. 1 should be understood as a highly idealized in regard thereto. Accordingly, while the design is known, realized structures corresponding thereto in small feature size regimes otherwise are not possible using current lithographic techniques. Additionally, even at larger feature size regimes, the invention provides benefits of thermal stability which can increase the heat budget tolerable in subsequent processes. Accordingly, no portion of FIG. 1, insofar as it represents actual structures formed in addition to representing an idealized design, is admitted to being prior art in regard to the present invention.

The structure 100 is formed on substrate (e.g. glass or semiconductor) 5 in which isolation structures may be formed in accordance with an individual device design by conventional techniques. If a field-effect transistor is to be formed at a location corresponding to the plane of the drawing cross-section, source and drain implants 15 will be formed either before or after (e.g. self-aligned with sidewalls 40) the structure 100 by conventional techniques well-understood in the art. The implants and other processes which may be required to form structures (not shown) in accordance with other aspects of a particular device design are unimportant to the practice of the invention other than involving a heat budget for processes such as, in the case of source and drain regions, annealing to repair implant damage to the substrate and diffusion of implanted dopants/impurities into region 15' which is provided as a meritorious effect of the invention. Gate insulator (e.g. oxide) layer 10 is also provided by deposition or growth to a desired thickness (e.g. 40–100 Angstroms) by techniques well-understood and familiar in the art.

Prior to the present invention, the gate/interconnect structure of FIG. 1 was formed by depositing a layer of polysilicon 25 followed by a layer of metal silicide 30 such as titanium silicide and a layer 35 of protective dielectric. The gate/interconnect structures were then patterned and annealed to develop a low sheet resistance phase in the metal silicide layer 30 relative to the sheet resistance of the as-deposited phase of the metal silicide. Sidewalls 40 could then be formed and other processes such as source and drain implantations followed by annealing, drive-in diffusion and the like carried out in accordance with the remainder of the design.

However, at smaller feature size regimes in which annealing to produce the low sheet resistance phase requires higher temperatures and/or longer annealing times, as discussed above, silicon may diffuse from the polysilicon layer 25 into the metal silicide layer 30 and precipitate at random locations to form agglomeration inclusions such as 45 or 55 which have a high resistance. This diffusion is particularly enhanced at grain boundaries along which diffusing silicon migrates.

Additionally, at some point, given sufficiently high temperature, metal from layer 30 will begin to diffuse into the polysilicon layer 25 and, in much the same manner, forms metal silicide inclusions 65. This phenomenon is referred to as polycide inversion in view of the concurrent silicon diffusion into the metal silicide from the polysilicon and metal diffusion into the polysilicon from the metal silicide. In severe cases where the polycide inversion phenomenon results, the precipitating metal silicide may pierce the oxide layer 10, as depicted at 75, resulting in device failure as described above.

It should be understood that agglomeration and/or inversion can occur during annealing intended to develop a low sheet resistance phase of the polymorphic metal silicide or during subsequent heat treatment steps or a combination thereof and results in randomly distributed regions of relatively high resistance. In general, the agglomeration effects are cumulative and agglomeration can be considered to be a precursor phenomenon to polycide inversion, the onset of which will be determined by temperature and the degree of agglomeration which has taken place at a particular point in the manufacturing process.

Therefore, the structure in accordance with the design of FIG. 1 can be considered to exhibit a degree of thermal instability which may or may not be accommodated by the size at which it is to be fabricated or processes required for formation of the remainder of the design. The invention provides a mechanism by which diffusion along grain boundaries may be markedly reduced, thus providing markedly increased thermal stability of the structure depicted in FIG. 1, regardless of the size at which it is fabricated and, accordingly, allowing the design of FIG. 1 to be reliably produced at feature size regimes not previously economically feasible or even possible.

Figure 2A:
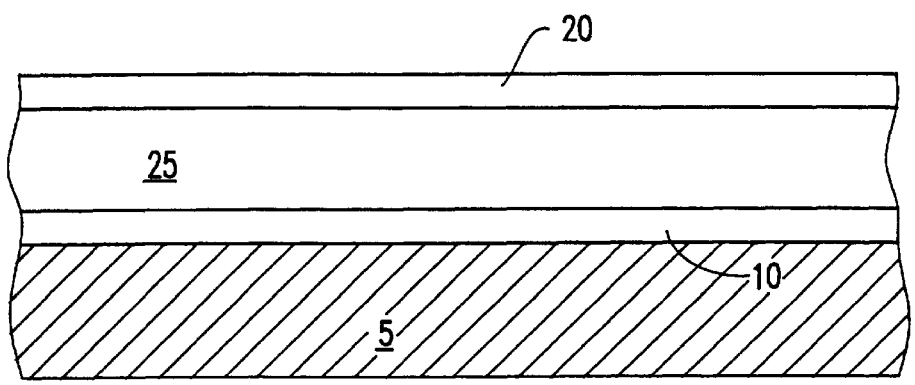
FIGS. 2A, 2B and 2C illustrate a sequence of process steps for forming a gate or interconnect structure using a polycide process in accordance with the invention.
Figure 2B:
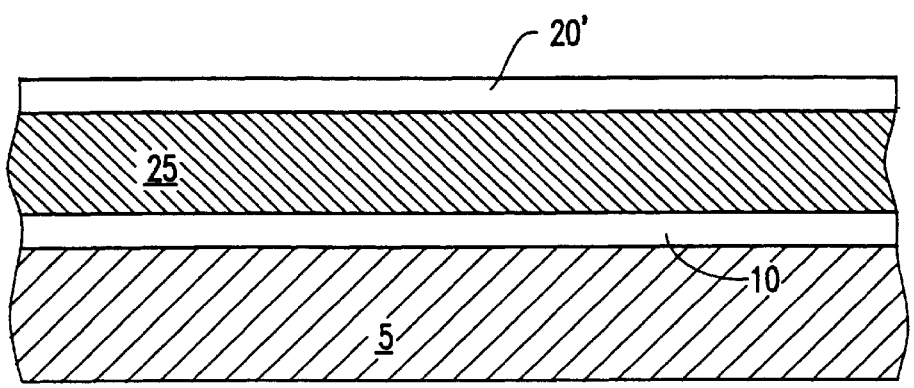
Figure 2C:
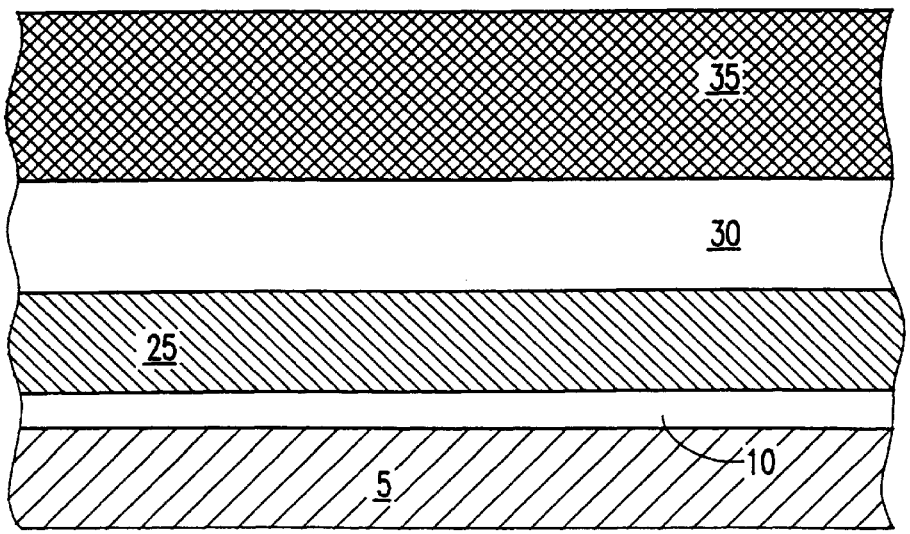

Referring now to FIGS. 2A–2C, the preferred process for fabrication of the structure of FIG. 1 at small cross-sectional dimensions and with greatly improved thermal stability in accordance with the invention will be described. Assuming prior formation, as necessary, of isolation structures 7 (FIG. 1) and formation of gate oxide 10 to a preferred but non-critical thickness of 10–80 Angstroms, a doped polysilicon layer 25 is deposited, as shown in FIG. 2A. Doping may be accomplished by conventional implant techniques or in-situ doping during deposition. Suitable and preferred dopants are arsenic or phosphorus for N+ and boron for P+ and the concentration or dose of dopant should be sufficient to stabilize the work function of the polysilicon. The doped polysilicon can be annealed to distribute the dopant(s) as may be desired or required.

As further shown in FIG. 2A, a sacrificial oxide layer 20 is deposited by conventional thermal oxidation techniques and preferably by growth during rapid thermal annealing for about sixty seconds at about 925° C. in an oxygen atmosphere. Since oxide layer 20 is sacrificial, its thickness is not critical although a currently preferred thickness is approximately 50 Angstroms. The oxide layer functions as a protective layer to prevent growth of nitride on polysilicon layer 25. It also allows removal of the oxynitride layer 20 formed in accordance with the invention as will be discussed below. Next, a nitridization process is preferably carried out by a further rapid thermal anneal (RTA) in an ammonia atmosphere for thirty seconds at a temperature of about 1050° C. The temperature and duration of the RTA should be adjusted in accordance with the thickness of the sacrificial oxide film 20 as can be extrapolated from the preferred thickness thereof and preferred nitridization parameters noted above by those skilled in the art.

The nitridization process, however carried out, serves to enrich the grain boundaries of the polysilicon layer 25 at least near the surface thereof with nitrogen species (depicted by shading) while converting the oxide film 20 into an oxynitride film 20', as shown in FIG. 2B. A chemical wet strip or other selective etching process is then used to remove the sacrificial oxide/oxynitride film 20/20' and expose the nitrogen enriched doped polysilicon.

Next, as shown in FIG. 2C, a metal silicide (e.g. titanium silicide) layer 30 is deposited, by conventional techniques, directly on the exposed polysilicon. It should be noted, in this regard, that the invention does not seek to employ any form of a diffusion barrier layer between the polysilicon layer and the metal silicide layer which might compromise the electrical characteristics of the composite layer and/or ohmic contact of the metal silicide to the doped polysilicon layer at the gate locations. In contrast, the barrier provided by the invention may be considered as a "porous barrier" since it exists substantially only along the grain boundaries within the polysilicon and thus does not affect the interface with other structures.

Sputter deposition or chemical vapor deposition are preferred techniques of depositing the metal silicide, preferably to a thickness of 500–1500 Angstroms for half-micron and quarter-micron feature size regimes. The metal silicide layer 30 is then capped with a protective dielectric layer 35 such as silicon dioxide, silicon nitride, a composite of the two (e.g. ONO) or the like, to isolate it from other elements which may be later formed in accordance with a particular device design. The resultant stacked structure is then patterned (e.g. lithographically) by conventional techniques to form gate/interconnect structures as desired. Annealing to develop a low resistance phase of the polymorphic metal silicide can be carried out before or after patterning.

To complete processing, sidewall spacers 45 (FIG. 1) can be formed and necessary implants and annealing thereof can be carried out, resulting in the structure of FIG. 1. The enrichment of the grain boundaries of the polysilicon with nitrogen has no discernable effect on the electrical properties of the polysilicon while the nitrogen thus introduced markedly inhibits migration of silicon species therealong and reduces the availability of silicon for diffusion to the metal silicide at the interface of the polysilicon and the metal silicide. Since such diffusion is thus inhibited, the design of FIG. 1 is reliably realized in structure closely corresponding to the idealized design depicted and without agglomeration and/or polycide inversion, regardless of the feature size regime at which the structure is fabricated. It should be appreciated that silicon diffusion is inhibited and silicon availability at the interface is greatly reduced if not avoided altogether. Accordingly, since silicon diffusion is a precursor to polycide inversion, polycide inversion and consequent device failure due to piercing of oxide layer 10 are effectively suppressed, resulting in greatly increased manufacturing yield.

To demonstrate the effectiveness of the invention in suppressing silicon agglomeration in the metal silicide layer 30, a test structure comprising a 110 Kbit gate array (as is found in memory devices) was fabricated with a (below half-micron feature size regime) gate line width of 0.4 $\mu$m (which defines transistor conduction channel length). The gate interconnections were comprised of a 1000 Angstrom thick layer of phosphorus doped polysilicon and a 1000 Angstrom thick layer of titanium silicide. Two sets of identical devices were fabricated: one by conventional techniques, as a control group, and the other by the process of the invention, as described above. All manufacturing process steps other than the formation of the sacrificial oxide and nitridization in accordance with the invention were identical for both sets of samples.

In the samples of the group formed in accordance with the present invention, the median sheet resistance, Rs, was 1.86 Ohms/sq. (corresponding closely with the expected Rs of C54 TiSi) with a 100% manufacturing yield (where a high resistance fail is defined as having a sheet resistance greater than 3.0 Ohms/sq.). In comparison, the control sample using conventional processing to form the polycide lines had a median Rs of 3.68 Ohms/sq. (which is associated with the presence of agglomeration inclusions of significant volume and area relative to the interconnect cross-section dimensions) and only an 8% manufacturing yield was achieved. The 100% manufacturing yield is indicative of a very substantial and significant increase in the window of manufacturing process parameters allowing the practice of the invention to reliably develop polycide gate/interconnect structures at much smaller feature size regimes with economically acceptable manufacturing yields. The increase in thermal stability of the polycide structure (and any other structure exhibiting any thermal instability due to silicon diffusion) and the increase in tolerable heat budget, while not quantifiable on the basis of this test, can certainly be appreciated, as well.

In view of the foregoing, it is seen that the invention provides an improved process for forming a metal silicide conductor in an integrated circuit which, in addition to titanium silicides, is applicable to silicides of other refractory metals such as platinum, tungsten, cobalt, nickel and molybdenum. The invention also provides a metal silicide and polysilicon composite conductor of improved thermal stability and which is far less susceptible to thermal degradation by agglomeration and inversion. It appears that the technique of the invention can increase the thermal stability of any structure including a polysilicon layer since the porous barrier formed by enrichment of the grain boundaries of the polysilicon by nitrogen species only affects the polysilicon layer in the preferred embodiment of the invention and greatly inhibits thermal mobility of silicon species therealong to inhibit diffusion across any interface with any other material. The invention can thus be considered to also stabilize other films or bodies of material deposited thereon. Moreover, the invention provides a technique for extension of the low sheet resistance properties of polymorphic metal silicides and titanium silicide, in particular, to structures smaller than the half-micron regime.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method for improving thermal stability of a metal polycide structure including a layer of metal silicide deposited on a layer of polysilicon, said method including the steps of enriching grain boundaries of the polysilicon layer with nitrogen near a surface of said polysilicon layer, and forming a metal silicide layer directly on said polysilicon layer.

2. A method as recited in claim 1, wherein said enriching step includes the steps of forming a sacrificial oxide layer on a surface of said body of polysilicon, heat treating said body of polysilicon and said oxide in a nitrogen atmosphere to form an oxynitride layer from said sacrificial oxide layer, and removing said oxynitride layer to expose said body of polysilicon.

3. A method as recited in claim 1, including the further step of forming said body of polysilicon on a substrate or semiconductor layer of an integrated circuit.

4. A method as recited in claim 1, wherein said polycide structure is a conductor.

5. A method as recited in claim 2, wherein said polycide structure is a conductor.

6. A method as recited in claim 1, wherein said polycide structure forms a transistor gate.

7. A method as recited in claim 2, wherein said polycide structure forms a transistor gate.

8. A method as recited in claim 1, wherein said polycide structure forms a control gate of a non-volatile memory cell.

9. A method as recited in claim 2, wherein said polycide structure forms a control gate of a non-volatile memory cell.

10. A method of forming a body of polysilicon exhibiting reduced thermal mobility of silicon, said method comprising the steps of enriching grain boundaries near a surface of said body of polysilicon with nitrogen, and exposing said surface of said body of polysilicon.

11. A method as recited in claim 10, wherein said enriching step includes the steps of forming a sacrificial oxide layer on a surface of said body of polysilicon, and heat treating said body of polysilicon and said oxide in a nitrogen atmosphere to form an oxynitride layer from said sacrificial oxide layer.

* * * * *